United States Patent
Lafarre et al.

(10) Patent No.: US 8,553,206 B2
(45) Date of Patent: Oct. 8, 2013

(54) LITHOGRAPHIC APPARATUS, COVERPLATE AND DEVICE MANUFACTURING METHOD

(75) Inventors: Raymond Wilhelmus Louis Lafarre, Helmond (NL); Nicolaas Ten Kate, Almkerk (NL); Laurentius Johannes Adrianus Van Bokhoven, Veldhoven (NL); Henricus Jozef Castelijns, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 500 days.

(21) Appl. No.: 12/881,878

(22) Filed: Sep. 14, 2010

(65) Prior Publication Data

US 2011/0069297 A1    Mar. 24, 2011

Related U.S. Application Data

(60) Provisional application No. 61/244,357, filed on Sep. 21, 2009.

(51) Int. Cl.
*G03B 27/58* (2006.01)
*G03B 27/32* (2006.01)

(52) U.S. Cl.
USPC .............................. 355/72; 355/77

(58) Field of Classification Search
None
See application file for complete search history.

(56) References Cited

U.S. PATENT DOCUMENTS

| | | | |
|---|---|---|---|
| 4,509,852 A | 4/1985 | Tabarelli et al. | |
| 7,352,435 B2 | 4/2008 | Streefkerk et al. | |
| 7,684,010 B2 | 3/2010 | Smulders et al. | |
| 2004/0136494 A1 | 7/2004 | Lof et al. | |
| 2004/0207824 A1 | 10/2004 | Lof et al. | |
| 2005/0094125 A1 | 5/2005 | Arai | |
| 2006/0038968 A1 | 2/2006 | Kemper et al. | |
| 2006/0119809 A1 | 6/2006 | Verhagen et al. | |
| 2006/0119817 A1 | 6/2006 | Hennus et al. | |
| 2006/0139614 A1 | 6/2006 | Owa et al. | |
| 2006/0158627 A1 | 7/2006 | Kemper et al. | |
| 2006/0203215 A1 | 9/2006 | Smulders et al. | |
| 2006/0232753 A1 | 10/2006 | Khmelichek et al. | |
| 2007/0177124 A1 | 8/2007 | Shneyder et al. | |

(Continued)

FOREIGN PATENT DOCUMENTS

| EP | 1420298 A2 | 5/2004 |
|---|---|---|
| EP | 1420300 A1 | 5/2004 |

(Continued)

OTHER PUBLICATIONS

Japanese Office Action mailed Apr. 24, 2012 in corresponding Japanese Patent Application No. 2010-204982.

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus, including a substrate table configured to hold a substrate; a positioner configured to position the substrate table relative to a projection system, the positioner including a short stroke module configured to perform fine positioning movements, on which the substrate table is held and which is supported on a long stroke module configured to perform coarse positioning movements; and a coverplate configured to at least partly cover a top surface of the short stroke module; wherein the coverplate is mounted to the long stroke module.

17 Claims, 7 Drawing Sheets

(56) References Cited

U.S. PATENT DOCUMENTS

| | | |
|---|---|---|
| 2008/0170215 A1 | 7/2008 | Streefkerk et al. |
| 2008/0212046 A1 | 9/2008 | Riepen et al. |
| 2008/0309891 A1 | 12/2008 | Chang et al. |
| 2008/0316441 A1* | 12/2008 | Liebregts et al. ............... 355/30 |
| 2009/0168037 A1 | 7/2009 | Kronnen et al. |
| 2009/0263747 A1* | 10/2009 | Coakley et al. ............... 430/311 |
| 2009/0296068 A1 | 12/2009 | Castelijns et al. |
| 2011/0069289 A1 | 3/2011 | Lafarre et al. |

FOREIGN PATENT DOCUMENTS

| | | |
|---|---|---|
| JP | 2002-164269 | 6/2002 |
| JP | 2003-315479 | 11/2003 |
| JP | 2005-142583 | 6/2005 |
| JP | 2006-253688 | 9/2006 |
| JP | 2011-066413 | 3/2011 |
| WO | 99/49504 | 9/1999 |
| WO | 2004/086470 | 10/2004 |
| WO | 2005/064405 | 7/2005 |

* cited by examiner

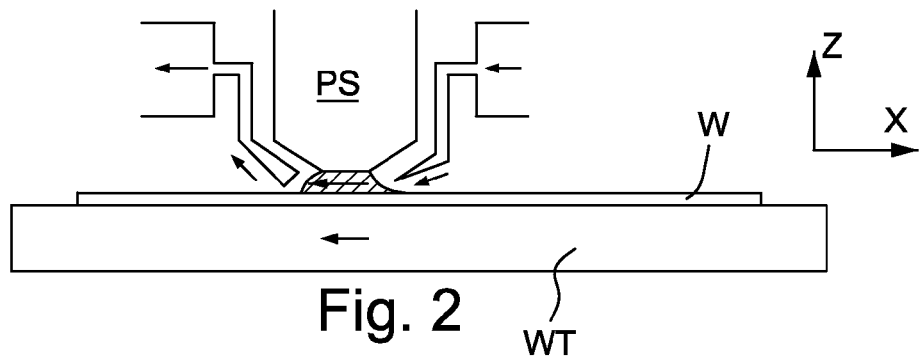
Fig. 2
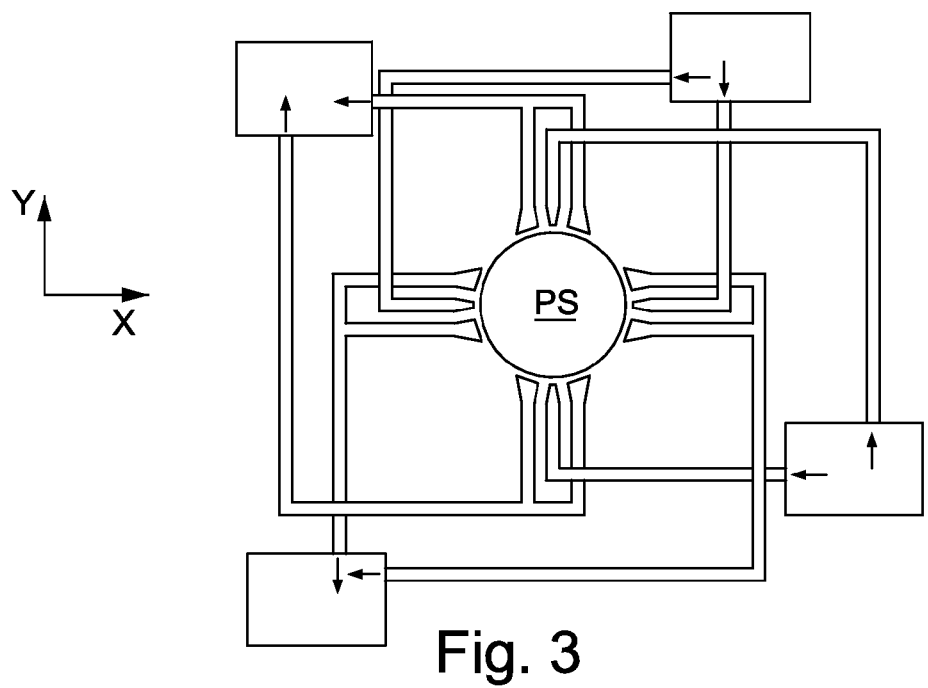
Fig. 3
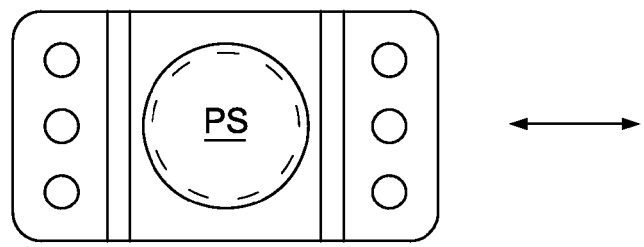
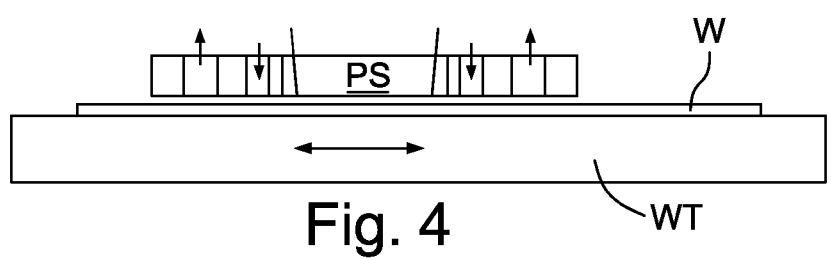
Fig. 4

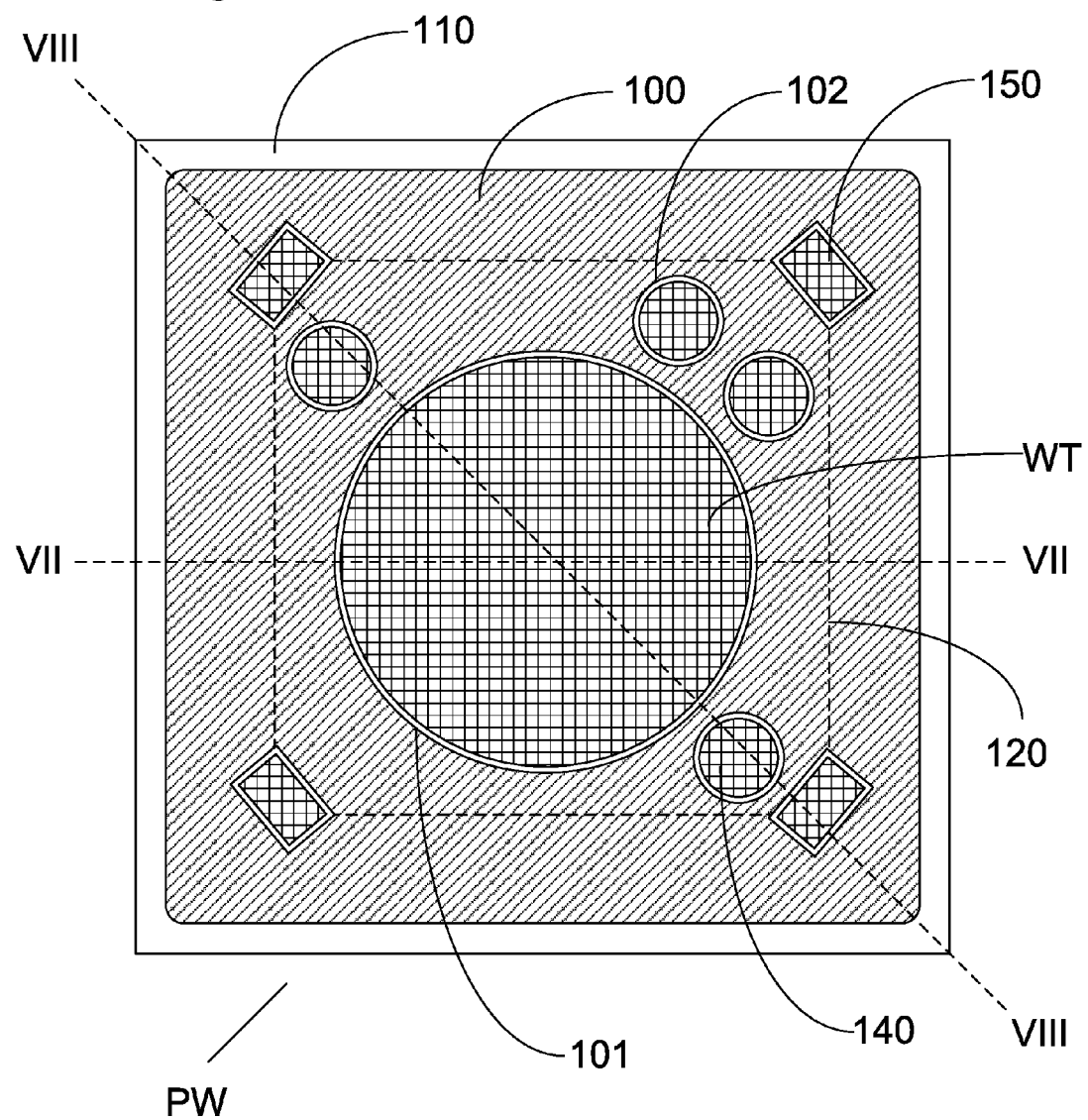

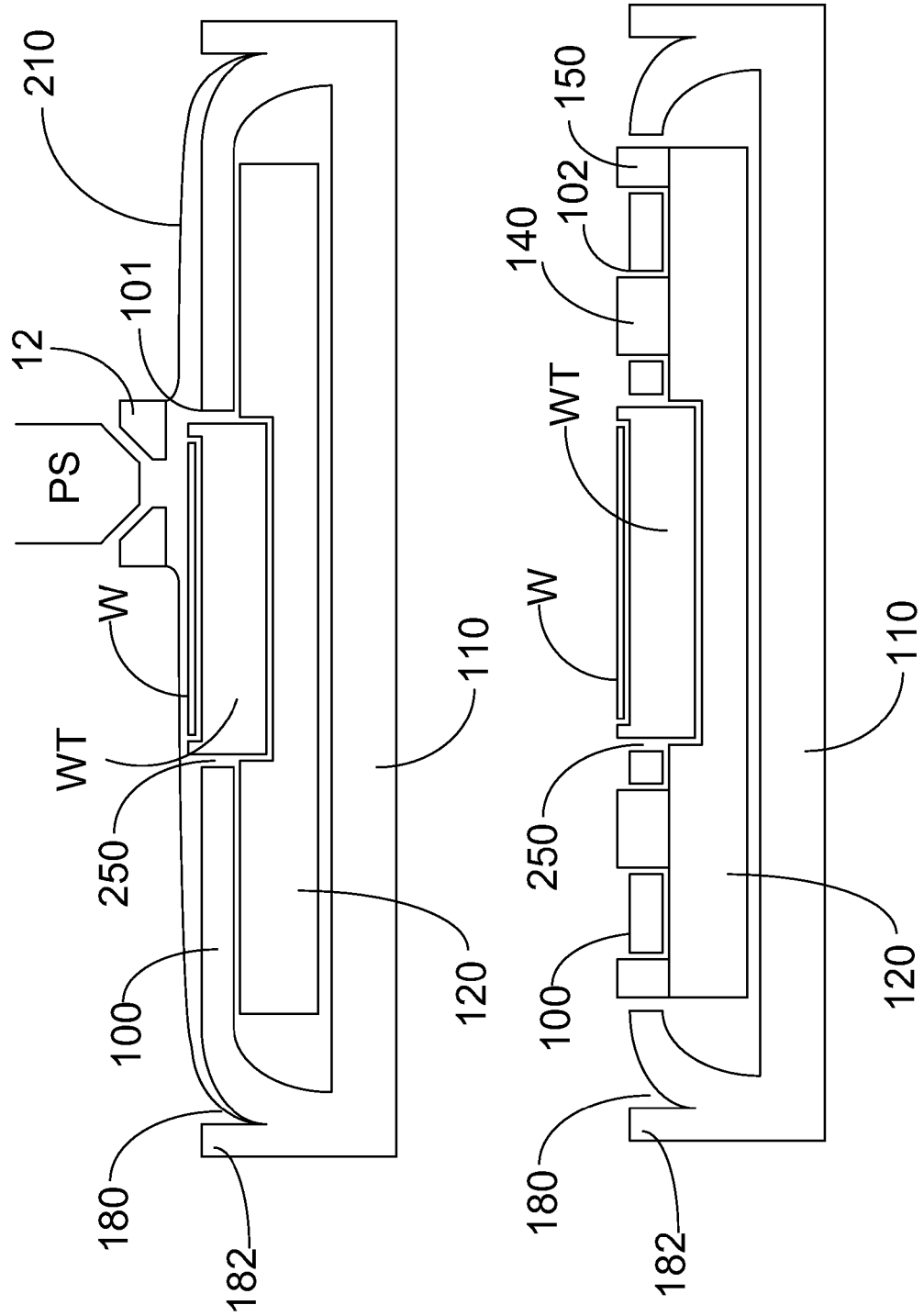

LITHOGRAPHIC APPARATUS, COVERPLATE AND DEVICE MANUFACTURING METHOD

CROSS REFERENCE TO RELATED APPLICATIONS

This application claims priority and benefit under 35 U.S.C. §119(e) to U.S. Provisional Patent Application No. 61/244,357, entitled "Lithographic Apparatus, Coverplate and Device Manufacturing Method", filed on Sep. 21, 2009. The content of that application is incorporated herein in its entirety by reference.

FIELD

The present invention relates to a lithographic apparatus, a coverplate and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, fluids may be suitable, particularly wetting fluids, incompressible fluids and/or fluids with higher refractive index than air, desirably a higher refractive index than water. Fluids excluding gases are particularly desired. The point of this is to enable imaging of smaller features since the exposure radiation will have a shorter wavelength in the liquid. The effect of the liquid may also be regarded as increasing the effective NA of the system and also increasing the depth of focus. Other immersion liquids have been proposed, including water with solid particles (e.g. quartz) suspended therein, or liquids with nano-particle suspensions (e.g. particles with a maximum dimension of up to 10 nm). The suspended particles may or may not have a similar or the same refractive index as the liquid in which they are suspended. Other liquids which may be suitable are hydrocarbons, such as aromatics, fluorohydrocarbons, and aqueous solutions.

However, submersing the substrate or substrate and substrate table in a bath of liquid (see for example U.S. Pat. No. 4,509,852) means that there is a large body of liquid that is accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. This type of arrangement may be referred to as a localized immersion system.

Another arrangement is an all wet arrangement in which the immersion liquid is unconfined as disclosed in WO2005/064405. In such a system the immersion liquid is unconfined. The whole top surface of the substrate is covered in liquid. This is beneficial because then the whole top surface of the substrate is exposed to the same conditions. This may have benefits for temperature control and processing of the substrate. In WO2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way.

Although such a system improves temperature control and processing of the substrate, evaporation of the immersion liquid can still occur. One way of alleviating that problem is described in US 2006/119809 in which a member is provided which covers the substrate in all positions and which is arranged to have immersion liquid extending between it and the top surface of the substrate and/or substrate table which holds the substrate.

In EP-A-1,420,300 and US patent application publication number US 2004-0136494, each hereby incorporated in their entirety by reference, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

After exposure of a substrate in an immersion lithographic apparatus, the substrate table is moved away from its exposure position to a position in which the substrate may be removed and replaced by a different substrate. This is known as substrate swap. In a two stage lithographic apparatus, the swap of the tables may take place under the projection system.

In an immersion apparatus, immersion liquid is handled by a fluid handling system or apparatus. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

In an immersion lithographic apparatus it is desirable to avoid liquid leaking onto sensitive components. The use of a coverplate over the substrate and/or over the surrounding area has been proposed for this. The coverplate sits on the surface it covers thereby increasing deleterious forces applied to a short stroke module of a positioner on which the substrate is held as well as increasing the mass of the short stroke module.

SUMMARY

It is desirable, for example, to provide a lithographic apparatus in which forces on the short stroke module of a positioner for positioning the substrate from the coverplate are eliminated or reduced.

According to an aspect, there is provided a lithographic apparatus, including: a substrate table for holding a substrate; a positioner configured to position the substrate table relative to a projection system, the positioner including a short stroke module for fine positioning movements, on which the substrate table is held and which is supported on a long stroke module for course positioning movements; and a coverplate for at least partly covering a top surface of the short stroke module; wherein the coverplate is mounted to the long stroke module.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 6 depicts, in plan, the substrate table, coverplate and positioner according to an embodiment;

FIG. 7 depicts, in cross-section, the substrate table, coverplate and positioner of FIG. 6 along line VII-VII;

FIG. 8 depicts, in cross-section, the substrate table, coverplate and positioner of FIG. 6 along line VIII-VIII;

DETAILED DESCRIPTION

Figure 1:
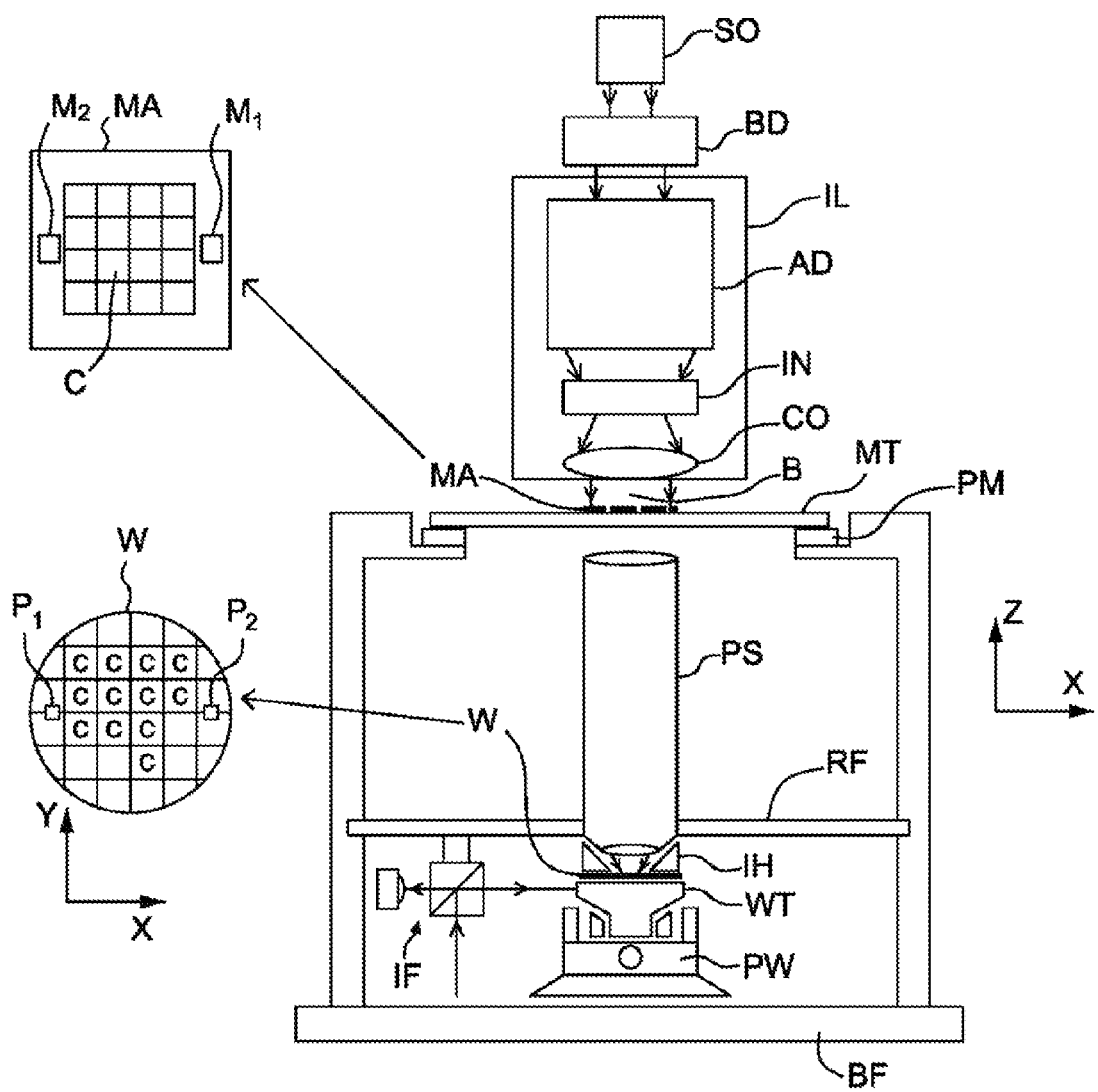
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device MA in accordance with certain parameters; a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the patterning device support MT (e.g., mask table), and is patterned by the patterning device MA. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam B is projected onto a target portion C (i.e. a single dynamic exposure). The velocity and direction of the substrate table WT relative to the patterning device support (e.g. mask table) MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the patterning device support (e.g. mask table) MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains stationary relative to the projection system PS while the substrate W moves underneath that area. FIGS. 2-5 show different supply devices which can be used in such a system. Sealing features are present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the wafer. Immersion liquid may be supplied to or in the region of a projection system and facing surface facing the projection system (such a facing surface may be the surface of a substrate and/or a substrate table). Any of the liquid supply devices of FIGS. 2-5 can also be used in such a system. However, sealing features are not present, are not activated, are not as efficient as normal or are otherwise ineffective to seal liquid to only the localized area.

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with liquid confinement structure which extends along at least a part of a boundary of the space between the final element of the projection system and the substrate table. Such an arrangement is illustrated in FIG. 5.

Figure 5:
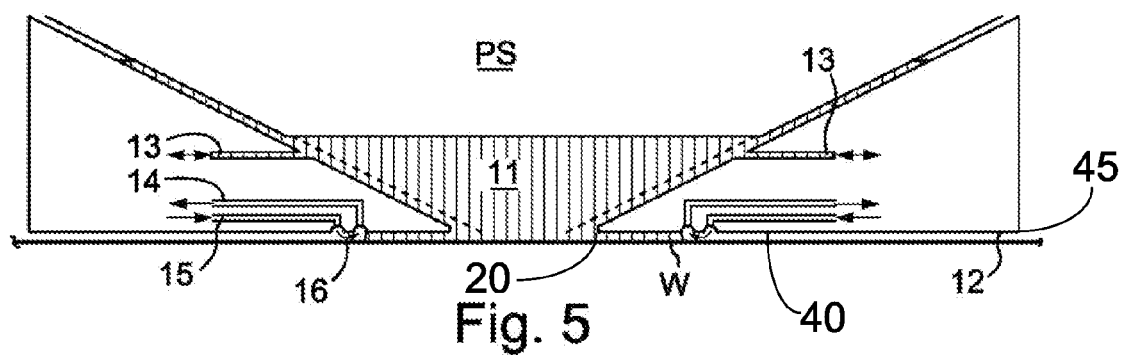
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. the coverplate 100 or substrate W). (Please note that reference in the following text to surface of the substrate W also refers in addition or in the alternative to a surface of the coverplate 100, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as a gas seal (such as system with a gas seal is disclosed in EP-A-1,420,298) or liquid seal.

The liquid confinement structure 12 at least partly contains liquid in the space 11 between a final element of the projection system PS and the substrate W. A contactless seal, such as a gas seal 16, may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by the gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Other types of liquid confinement structure to which the present invention may be applied include the so called gas drag liquid confinement structure such as that described in U.S. Application Ser. No. 61/181,158 filed 26 May 2009, which is hereby incorporated by reference. US 2008/0212046 provides further details and its content is also hereby incorporated by reference in its entirety.

The example of FIG. 5 may be a so called localized area arrangement in which liquid is only provided to a localized area of the top surface of the substrate W at any one time. Other arrangements are possible for example, an arrangement using a single phase extractor on the undersurface 40 of the liquid confinement structure 12 may be used. An extractor assembly including a single phase extractor with a porous member is described in United States Patent Application No. US 2006/0038968, incorporated herein in its entirety by reference. An arrangement in which such an extractor assembly is used in combination with a recess and a gas knife is disclosed in detail in United States Patent Application Publication No. US 2006/0158627 incorporated herein in its entirety by reference. An embodiment of the invention may be applied to a fluid handling structure used in all wet immersion apparatus. In the all wet embodiment, fluid is allowed to cover the whole of the top surface of the substrate and surrounding surface, for example, by allowing liquid to leak out of a confinement structure which confines liquid to between the final element of projection system and the substrate. An example of a fluid handling structure for an all wet embodiment can be found in U.S. patent application No. U.S. 61/136,380 filed on 2 Sep. 2008.

In all of the above liquid confinement structures, liquid is provided to a space 11 between the projection system PS and the substrate W and/or substrate table WT. In the example of FIG. 5 this is provided through outlet 13.

It is desirable to prevent immersion liquid from reaching delicate parts of the immersion apparatus. Particular examples are control circuits, electronics and actuators of the positioner PW which positions the substrate table WT and therefore substrate W under the projection system PS. One way of doing this is to provide a coverplate 100 over parts of the positioner PW which might otherwise come in contact with immersion liquid.

FIG. 6 illustrates, in plan, a substrate table WT, coverplate 100 and positioner PW according to an embodiment. The coverplate 100 is optimized for use in an all wet immersion apparatus. However, the coverplate 100 may also be used in combination with any of the above localized area liquid supply solutions described above or any other type of apparatus, in particular any type of immersion apparatus. The benefits of both types of immersion apparatus of the coverplate 100 of embodiments of the present invention are the same. That is, there is a reduction of forces transmitted between the coverplate 100 and the substrate table WT. Furthermore, the mass of the short stroke module 120 of the positioner is reduced. This allows the area of the short stroke module 120 to be reduced and the size of actuators configured to position the short stroke module 120 are also reduced because of the lower static forces on the short stroke module 120. The Eigen frequency of the short stroke module 120 may be increased resulting in higher controller bandwidth.

The positioner PW is included of a long stroke module 110 which is configured to coarse position the substrate table WT. A short stroke module 120 is supported by the long stroke module 110. The short stroke module is configured to fine position the substrate table WT. The short stroke module 120 is moveable relative to the long stroke module 110. The substrate table WT is held on the short stroke module 120, in fixed relation thereto. Sensors 140 may be held on the short stroke module 120. Sensors 140 on the short stroke module 120 may include in a non limiting list, transmission or through image sensors (TIS), ILIAS sensors, spot sensors and encoder grids 150.

The substrate table WT supports the substrate W. In one embodiment the substrate table WT is a so called pimple table. The pimple table includes a surface with a plurality of projections. An under pressure is applied between the projections and the substrate W which sits on the projections. This holds the substrate securely to the substrate table WT. Other types of substrate table WT include electrostatic clamps.

The coverplate 100 is mounted to the long stroke module 110. The coverplate 100 is not in contact with the short stroke module 120 or any items mounted to the short stroke module 120. Therefore, the coverplate 100 is substantially mechanically decoupled from the substrate table WT as well as from the short stroke module 120. The short stroke module 120 can move relative to the coverplate 100, as will be described below. The coverplate 100 is in a fixed position relative to the long stroke module 110.

The stiffness of the long stroke module 110 is improved by the presence of the coverplate 100 and the attachment of the coverplate to the long stroke module 110.

A first through hole 101 is provided in the coverplate 100. The through hole 101 is large enough such that a substrate W positioned on the substrate table WT can be imaged by a projection beam from the projection system PS without the projection beam needing to pass through the coverplate 100. That is, the projection beam passes through the first through hole 101 from a projection system PS onto the substrate W. As can be seen from FIG. 7, the first through hole 101 may also be large enough to accommodate an edge of the substrate table WT. The edge of the substrate table WT may be uncovered, in use, by the substrate W.

Further through holes 102 are provided in the coverplate 100 for the passage of a radiation beam, such as a projection beam from the projection system PS therethough onto a respective sensor 140.

Thus, the coverplate 100 surrounds the substrate W, the substrate table WT and sensors 140.

Provision of through holes 101, 102 in the coverplate 100 avoid errors in both imaging and measurement being introduced by the projection beam having to pass through the coverplate 100. The provision of through holes 101, 102 ensures that direct contact between the coverplate 100 and the short stroke module 120 or items placed or held on the short stroke module 120 may be avoided. Thereby transmission of deleterious forces from the coverplate 100 to the short stroke module 120 is also avoided.

The position of the short stroke module 120 may be monitored by a position measurement system. A position measurement system may include one or more sensors 150 and one or more grid plates. One of the sensor 150 and grid plates is mounted in known relation to the projection system PS. The other of the sensor 150 and grid plate is mounted on the short stroke module 120.

The sensors 150 include a transmitter and receiver. A beam of radiation passes from the transmitter to the grid plate and is reflected back to the receiver. By analyzing the signal received by the receiver the position of the sensor 150 relative to the grid plate can be calculated. In this way the position of the short stroke module 120 relative to the projection system PS may be calculated.

In the embodiment illustrated in FIG. 6 sensors 150 of the position measurement system are mounted on the short stroke module 120. In the embodiment of FIG. 6 there are four sensors 150 mounted at the corners of the short stroke module 120. A corresponding grid plate or grid plates are mounted above the substrate table WT in fixed relationship to the projection system PS. In an alternative embodiment grid plates may be attached to the short stroke module 120 in place of the sensors 150 and the sensors mounted above the substrate table WT in known relation to the projection system PS. In an embodiment, the coverplate 100 surrounds the sensors 150 or grid plates. In an embodiment, the sensors 150 or grid plates may be located near or at the edge of the coverplate 100. The coverplate 100 may be shaped to receive the sensors 150 or grid plates without surrounding them.

As can be seen, the coverplate 100 does not cover the sensors 150. Therefore, any beams of radiation of the position measurement system pass directly between the sensor 150 and the grid plate without passing through the coverplate 100.

Gaps exist between the substrate table WT, the substrate W, sensor 140 or short stroke module 120 and the coverplate 100 or long stroke module 110. Such gaps are large enough to accommodate the stroke of the short stroke module 120. It may be desirable to keep such gaps as small as possible so that the gap varies in size from being virtually non existent to being the size of the maximum stroke of the short stroke module 120. It is deleterious that immersion liquid passes through such a gap in an uncontrolled way. In one embodiment, stickers may be provided to cover the gap. In this way immersion liquid is prevented from entering the gap. The stickers are desirably flexible and/or of low stiffness (low E-modulus) so as to avoid (disturbance) force being transferred from the coverplate 100 (and long stroke module 110)

to the short stroke module 120. Alternatively or additionally one or more of the gaps may be treated with one of the seals illustrated in FIGS. 9 and 10 and described below. A higher maximum elastic strain is desirable in order to achieve a sufficient lifetime. For a given range of dynamic gap size, a material with a higher maximum elastic strain allows a smaller sticker to be used.

In both the all wet type of immersion apparatus and the localized area type of immersion apparatus liquid may find its way over a gap such as between the substrate table WT, the substrate W, sensor 140 or short stroke module 120 and the coverplate 100 or long stroke module 110. For example, when imaging the edge of a substrate W in the localized area immersion apparatus the liquid confinement structure may be partly over the substrate W and partly over the coverplate 100. Additionally, when the assembly illustrated in FIG. 6 is moved under the projection system PS such that a sensor 140 is under the projection system PS, the liquid confinement structure may move over the gap between the substrate table WT and the coverplate 100 and between the coverplate 100 and the sensor 140. In an all wet immersion apparatus liquid will desirably cover the whole of the coverplate 100 and be collected in a gutter 180 around an edge of the coverplate 100 (illustrated in more detail in FIGS. 7 and 8). The gutter 180 may surround the coverplate 100.

FIG. 7 illustrates a cross section of the assembly of FIG. 6 through line VII-VII. As can be seen, the coverplate 100 is attached at its end to the long stroke module 110. There is no contact between the short stroke module 120 and the coverplate 100. A through hole 101 exists in which the substrate table WT is positioned. Desirably the plane of the top surface of the cover plate 100 is within +/−40 μm of the plane of the top surface of the substrate W. This magnitude of difference in height can be dealt with if the bottom surface of the liquid supply system is 100-300 μm above the plane of the top surface of the substrate W. If this is not possible, the height of the top surface of the coverplate 100 is lower than the top surface of the substrate table WT and the substrate W (as illustrated). That is, there is a difference in the distance of the plane of the top surface of the coverplate 100 from the projection system PS to the plane of the top surface of the substrate W from the projection system PS. This difference in distance may be up to 100 or even up to 300 μm. This helps in ensuring the desired direction of fluid flow. The top surface of the sensor 140 may be in the same plane as the top surface of the substrate W.

A positioner is located between the long stroke module 110 and short stroke module 120 which effectively decouples the short stroke module 120 from the long stroke module 110. The gap between the edge of the coverplate 100 defining the through hole 101 and the substrate table WT is large enough to accommodate the stroke of the short stroke module 120. The gap may be of the order of 1 mm which is a typical stroke of a short stroke module 120. Also illustrated in FIG. 7 is a liquid supply system 12. As can be seen, the liquid supply system is of the all wet type. Therefore, the liquid is unconfined by the liquid supply system 12. A film of liquid 210 covers the top surface of the substrate W and the coverplate 100 irrespective of whether or not they are positioned under the projection system PS and/or liquid supply system 12.

When the film of liquid 210 reaches an edge of the coverplate 100 it is collected by a gutter 180. The edge of the coverplate 100 is curved (for example in accordance with what is described in U.S. application Ser. Nos. 60/996,737 and U.S. 61/176,802. The edge of the coverplate 100 is curved downwards away from projection system PS. This helps in encouraging liquid to flow off the edge of the coverplate as well as maintaining the edge of the coverplate wet. The gutter may be continuous or non-continuous around the outer edge of the coverplate 100. As illustrated, the coverplate 100 may include a projection 182 radially outwardly of the gutter 180 with respect to the substrate table WT thereby to prevent any liquid spilling out of the gutter 180 before being removed from the gutter. The curve of the edge of the coverplate 100 extends all the way into the gutter 180, from where the immersion liquid is removed. Extending the curve of the edge of the coverplate 100 into the gutter 180 helps to ensure that liquid flows efficiently to the gutter 180 from the coverplate 100. For example that no dripping or splashing of immersion liquid occurs as it moves into the gutter 180. Immersion liquid may be removed from the bottom of the gutter 180 through one or more openings. For example, immersion liquid may be sucked through the openings which are attached to an under-pressure source.

FIG. 8 is a cross-section of the assembly illustrated in FIG. 6 along lines VIII-VIII. The sensors 150 are enclosed in a through hole in the coverplate 100 in the same way as the substrate table WT and sensors 140 mounted on the short stroke module 120. It may be necessary to include a groove or gutter in the coverplate surrounding the sensors 150 so as to avoid liquid flowing over or splashing onto the sensors 150. In an alternative embodiment the coverplate 100 is shortened at the corners so as not to enclose the sensors 150. The gutter 180 runs in front of the sensors 150.

So that the coverplate 100 is mechanically decoupled from the short stroke module 120, the substrate table WT, the substrate W and any sensors 140 there are physical gaps between the coverplate 100 and those objects. The gaps allow the short stroke module 120 to move relative to the coverplate 100 in the plane of the coverplate 100. As described above, those gaps can, in some instances, be covered with stickers. In other instances that may not be acceptable. In those instances a seal such as that illustrated in FIG. 9 or 10 could be employed. Additionally, a seal such as that illustrated in FIGS. 9 and 10 can be employed in other circumstances where liquid could seep into a gap between a first object and a second object. For example, in the case where the immersion liquid runs over the top surface of the short stroke module 120 or a coverplate 100 attached to the short stroke module 120, any gutters for collecting immersion liquid from an edge of the short stroke module 120 or coverplate 100 may be carried by the long stroke module 110. In this case a gap will exist between the short stroke module 120 or coverplate 100 and the surfaces forming the gutter.

Figure 9:
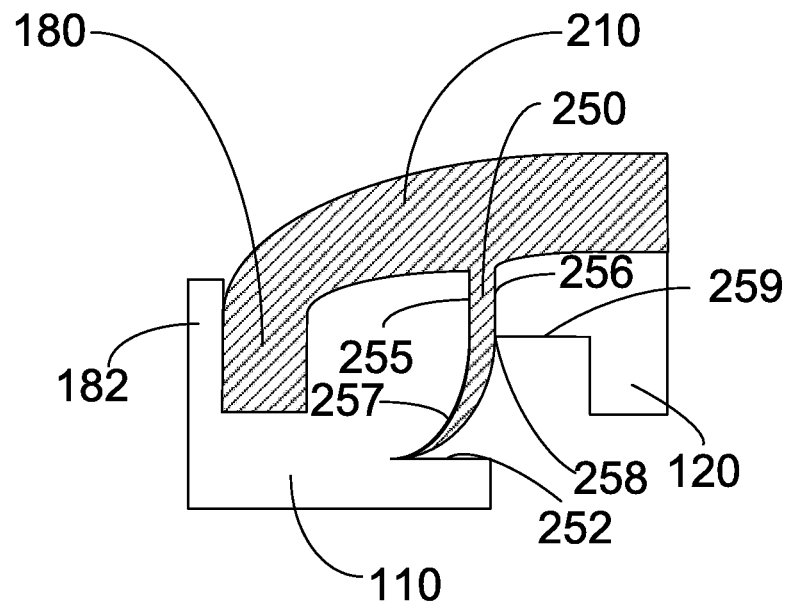
FIG. 9 depicts, in cross-section, a seal between first and second objects according to an embodiment.
Figure 10:
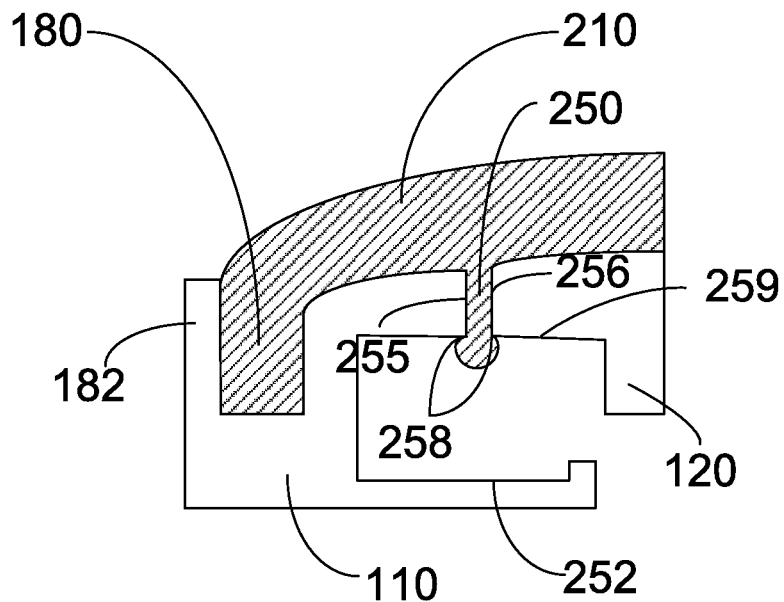
FIG. 10 depicts, in cross-section, a seal between first and second objects according to an embodiment.

As illustrated in FIGS. 9 and 10 which are cross-sectional views of two embodiments of seal, a gap 250 exists between a surface of the long stroke module 110 and the short stroke module 120. Thus, a gap 250 exists between a first object and a second object on whose top surfaces immersion liquid is provided (in the form of a film 210). The gap 250 could alternatively be any of the gaps illustrated in FIGS. 7 and 8 or described above or any other gap.

In the embodiment of FIG. 9 immersion liquid is deliberately allowed to flow through the gap 250. However, the flow is controlled positionally so that any liquid which does pass through the gap 250 can be collected in a sub-gutter 252 positioned under the gap 250. A surface 255 of the long stroke module 110 (including the coverplate 100 or gutter 180) and a surface 256 of the short stroke module 120 define the gap. These surfaces 255, 256 face each other and the immersion liquid has an advancing contact angle with them of less than 30°, desirably less than 25° and more desirably less than 20°. That is, the surfaces defining the gap 250 are lyophilic to the immersion liquid.

One of the surfaces 255, 256 defining the gap 250 extends in the form of an extending surface 257 to the sub-gutter 252. There is no abrupt change of angle between the surface 255 defining the gap and the extending surface 257. That is, the surface is smooth. The surface 257 which extends to the sub-gutter 252 desirably has the same characteristics as the surfaces 255, 256 defining the gap 250. That is, immersion liquid has an advancing contact angle with the extending surface 257 extending to the sub-gutter 252 of less than 30°, desirably less than 25° and more desirably less than 20°. In this way liquid which passes through the gap 250 runs down the extending surface 257 which extends to the sub-gutter 252 and into the sub-gutter 252 where the liquid may be removed or may be passed to the main gutter 180. The sub-gutter 252 is desirably mounted on the long stroke module 110, but this is not necessarily the case.

The surface 256 which defines the gap 250 which is opposite to the surface 255 which extends via extending surface 257 to the sub-gutter 252 has an edge 258 defined in it at the end of the gap 250. That is, the surface 256 has an abrupt change of angle. For example, the plane of the surface 256 defining the gap is at an angle of less than 90° relative to the plane of an adjacent surface 259 on the other side of the edge 258. That angle is illustrated as being 90° in FIG. 9 but may be less, desirably as low as possible, for example less than 10°, less than 50°, less than 60°, less than 70° or less than 80°; i.e. the angle may be in the range of less than 90°, preferably less than 50° or in the range of 10° to 90°.

In one embodiment the immersion liquid has an advancing contact angle of greater than 90°, desirably greater than 100° and more desirably greater than 110° with the surface 259 on the other side of the edge 258 and adjacent to the surface 256 defining the gap. This is beneficial because the surface 259 is thereby lyophobic and encourages the liquid to detach from the short stroke module 120 at the end of the gap 250.

The seal of FIG. 10 is the same as that of FIG. 9 except as described below. Because the width of the gap is of the order of 1 mm (e.g. the inaccuracy of the long stroke module 110 relative to the short stroke module 120) it is possible to generate a large surface tension force on liquid in the gap acting on the liquid such that it remains in the gap. This is possible if surfaces 255, 256 defining the gap 250 both have an edge 258 and/or a surface 259 with which the immersion liquid has a high advancing contact angle, of for example greater than 90°, desirably greater than 100°, more desirably greater than 130° and most desirably greater than 150°. Immersion liquid in such a seal can withstand a pressure of about 1 mBar. That is, the surface tension of the meniscus bridging the edges 258 withstands this pressure which is equal to about 10 mm height of liquid (water). As shown in FIG. 10 pressure may be generated in the seal, and the seal may prevent liquid from flowing through the gap 250. However, it may be that forces are generated on the immersion liquid 210 which overcome the seal (for example in the case of a localized liquid supply system a gas knife directed downwards passing over the gap 250) and so a sub-gutter 252 is provided to catch any drops. As in the embodiment of FIG. 9, the sub-gutter 252 is connected to the long stroke module 110 thereby avoiding introducing disturbance forces into the short stroke module 120.

Figure 11:
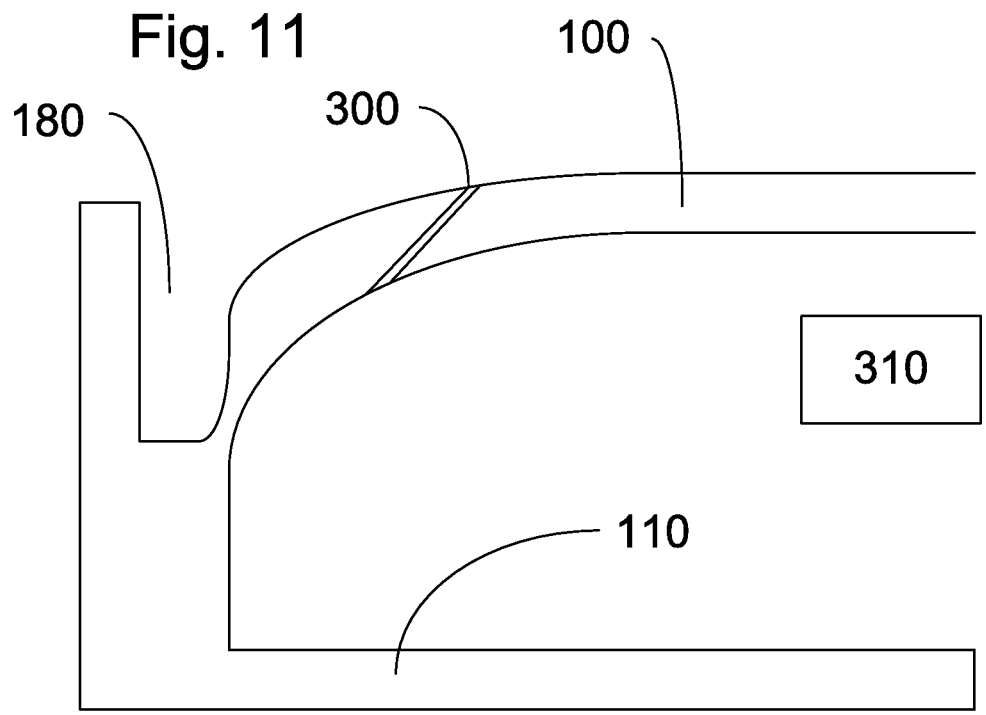
FIG. 11 depicts, in cross-section, an edge supply according to an embodiment.
Figure 12:
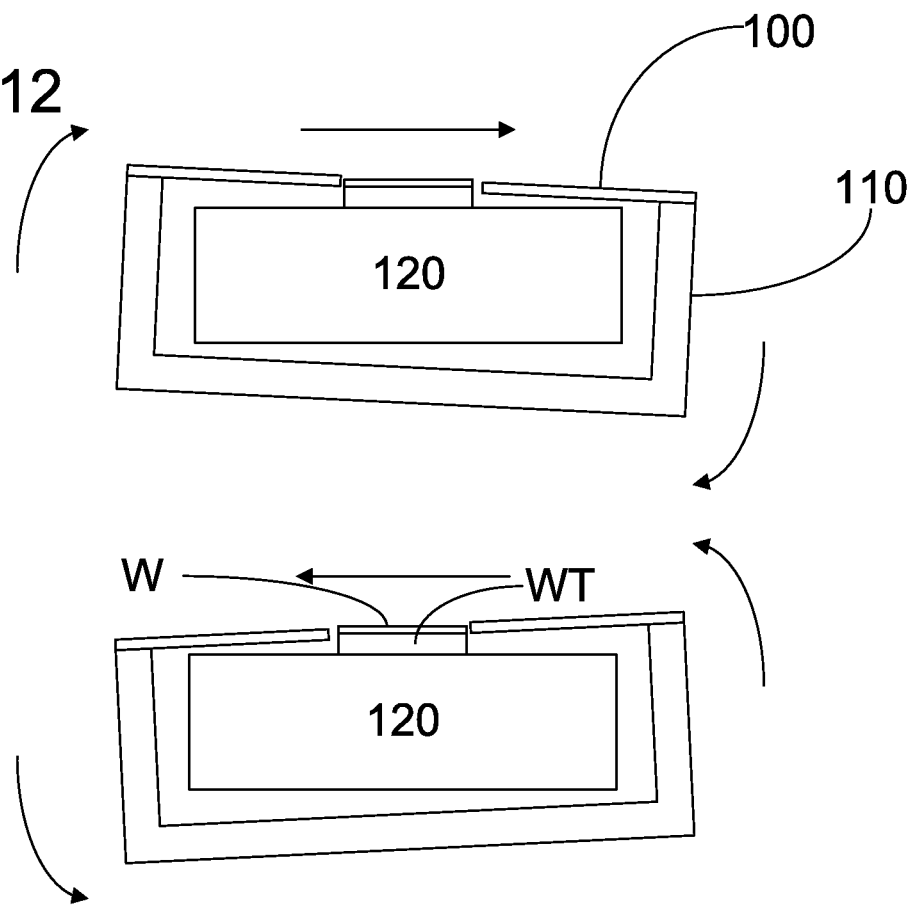
FIG. 12 depicts schematically tilting of a coverplate according to an embodiment.

In an all wet immersion apparatus de-wetting of the surface surrounding the substrate W is deleterious. It has been found that de-wetting of a coverplate 100 is most likely to occur at its edges where the immersion liquid leaves the coverplate 100. In particular, a leading edge of the coverplate 100 has been found to be prone to de-wetting. This may be due to forces being applied to the immersion liquid by movement of the coverplate 100. The inertia of the immersion liquid means that it tends to be left behind when the coverplate 100 moves. The film of liquid at the leading edge becomes thinner and the film breaks up into droplets at a thickness of under about 30 µm. FIGS. 11 and 12 show two measures which can be taken to address this issue. This is done in one embodiment by preventing the film thickness at the leading edge from falling below about 30 µm, for example.

In FIG. 11 an opening 300 is provided adjacent an edge of the surface over which immersion liquid flows (which may be lyophilic to the immersion liquid). As illustrated in FIG. 11 this is a surface of the long stroke module 110 close to the gutter 180. However, the opening 300 may also be provided adjacent an edge of a coverplate 100, or between the surface of the long stroke module 110 (or coverplate 100) and the edge of the short stroke module 120 surface adjacent the areas in which the sensors 140 are positioned. The opening 300 may be a single slit or may be a plurality of discrete openings such as holes or slits.

The opening 300 is attached to a liquid source under the control of a controller 310.

Liquid may be provided continually through opening 300 to the surface over which immersion liquid flows. The controller 300 controls supply of fluid through the opening 300 to start supplying or to increase the supply of liquid through opening 300 at points around the outer edge of the surface over which immersion liquid flows which are a leading edge during movement of the surface. Conversely, the controller 310 may reduce supply or prevent supply of liquid through the opening 300 to a trailing edge of the outer edge of the surface over which immersion liquid flows. Therefore, it can be seen that liquid may be provided through the opening 300 in varying amounts around the circumference of the surface over which immersion liquid flows (e.g. a coverplate 100). In this way, liquid is provided to the surface at the area where de-wetting is most likely to occur and at a time when de-wetting is most likely to occur. The provision of extra fluid can help to ensure that de-wetting does not occur.

FIG. 12 shows a further embodiment which may be used in conjunction with the embodiment of FIGS. 6, 7 and 8. In this embodiment advantage is taken of the fact that the coverplate 100 moves independently of the short stroke module 120. Therefore, the short stroke module 120 is moved under control of controller 310 in the normal way (for example such that the top surface of the substrate W is substantially perpendicular to the projection beam PB or optical axis of the projection system PS). However, the angle of the coverplate 100 may be tilted from parallel to the top surface of the substrate to encourage flow of liquid in a particular direction thereby avoiding de-wetting. Thus, the coverplate, in particular by being attached to the long stroke module 110 is tiltable independently of the substrate table WT which is mounted on the short stroke module 120. The controller 310 can control the long stroke module 110 thereby to tilt the coverplate 100 relative to the optical axis of the projection system PS during movement of the substrate table WT and coverplate 100. If the coverplate 100 is tilted such that its leading edge is lower than its trailing edge liquid may flow towards the leading edge thereby reducing the risk of de-wetting at the leading edge. It is at the leading edge where de-wetting is most likely to occur.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may include a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment there is provided a lithographic apparatus, comprising a substrate table, a positioner and a coverplate. The substrate table is configured to hold a substrate. The positioner is configured to position the substrate table relative to a projection system. The positioner comprises a short stroke module configured to perform fine position movements. The short stroke module holds the substrate table and is supported on a long stroke module configured to perform coarse position movements. The coverplate is configured to at least partly cover a top surface of the short stroke module. The coverplate is mounted to the long stroke module.

The coverplate may be substantially mechanically decoupled from the short stroke module. The coverplate may be moveable relative to the short stroke module. The coverplate may be fixed in position relative to the long stroke module.

The coverplate may be mechanically decoupled from the substrate table.

The lithographic apparatus may be an immersion lithographic apparatus.

In an embodiment there is provided an immersion lithographic apparatus comprising a substrate table, a positioner and a coverplate. The substrate table is configured to hold a substrate. The positioner is configured to move the substrate table relative to a projection system. The coverplate is configured to cover at least part of the positioner, wherein the coverplate is substantially mechanically decoupled from the substrate table.

The coverplate may comprise a through hole for the passage of a projection beam from the projection system therethrough onto a substrate.

The positioner may comprise a short stroke module configured to fine position movements on which the substrate table is held.

The coverplate may comprise a through hole for the passage of a projection beam from the projection system therethrough onto a sensor, wherein the sensor is mounted on the short stroke module.

The through hole may be large enough to accommodate a stroke of the short stroke module without any part of the sensor and/or substrate being covered by the coverplate.

The apparatus may further comprise a sensor or a grid plate from a position measurement system mounted to the short stroke module. Any beams of radiation from the position measurement system may pass directly between the sensor and the grid plate without passing through the coverplate.

The plane of the top surface of the coverplate may be further from the projection system than the plane of the top surface of the substrate and/or sensor is from the projection system.

The difference in distance of the plane of the top surface of the coverplate from the projection system to the plane of the top surface of the sensors and/or substrate from the projection system may be up to 100 μm.

The immersion lithographic apparatus may further comprise a gutter for the collection of immersion liquid from an outer portion of the coverplate.

The apparatus may further comprise one or more gutters for the collection of immersion liquid which finds its way between the coverplate and an object which the coverplate surrounds but does not cover.

An outer edge of the coverplate may be curved downwards.

The apparatus may further comprise an outlet adjacent an outer edge of the coverplate configured to supply therethrough immersion liquid.

The apparatus may further comprise a liquid supply system configured to supply liquid to cover a top surface of the substrate and a top surface of the coverplate.

In an embodiment there is provided a coverplate for covering a top surface of a short stroke module of a positioner. The positioner is configured to position a substrate in an immersion lithographic apparatus. The coverplate comprises a sheet of material with at least one through hole in it for the positioning therein of a substrate and/or substrate table.

In an embodiment there is provided a device manufacturing method comprising holding a substrate on a substrate table. The method further comprises positioning the substrate table relative to a projection system using a positioner. The positioner comprises a short stroke module for fine positioning movements. On the short stroke module the substrate table is held. The method further comprises supporting the short stroke module on a long stroke module for coarse positioning movements. The method further comprises covering at least partly a top surface of the short stroke module using a coverplate mounted to the long stroke module.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a substrate table configured to hold a substrate;
   a positioner configured to position the substrate table relative to a projection system, the positioner comprising a short stroke module configured to perform fine position movements, on which the substrate table is held and which is supported on a long stroke module configured to perform coarse position movements; and
   a coverplate configured to at least partly cover a top surface of the short stroke module;
   wherein the coverplate is mounted to the long stroke module.

2. The apparatus of claim 1, wherein the coverplate is substantially mechanically decoupled from the short stroke module.

3. The apparatus of claim 1, wherein the coverplate is moveable relative to the short stroke module.

4. The apparatus of claim 1, wherein the coverplate is fixed in position relative to the long stroke module.

5. The apparatus of claim 1, wherein the coverplate is mechanically decoupled from the substrate table.

6. The lithographic apparatus of claim 1, wherein the lithographic apparatus is an immersion lithographic apparatus.

7. The apparatus of claim 1, wherein the coverplate comprises a through hole for the passage of a projection beam from the projection system therethrough onto a substrate.

8. The apparatus of claim 1, wherein the coverplate comprises a through hole for the passage of a projection beam from the projection system therethrough onto a sensor, wherein the sensor is mounted on the short stroke module.

9. The apparatus of claim 8, wherein the through hole is large enough to accommodate a stroke of the short stroke module without any part of the sensor and/or substrate being covered by the coverplate.

10. The apparatus of claim 1, further comprising a sensor or a grid plate from a position measurement system mounted to the short stroke module, wherein any beams of radiation from the position measurement system pass directly between the sensor and the grid plate without passing through the coverplate.

11. The apparatus of claim 1, wherein the plane of the top surface of the coverplate is further from the projection system than the plane of the top surface of the substrate and/or a sensor is from the projection system.

12. The apparatus of claim 11, wherein the difference in distance of the plane of the top surface of the coverplate from the projection system to the plane of the top surface of the sensor and/or substrate from the projection system is up to 100 µm.

13. The apparatus of claim 1, further comprising one or more gutters for the collection of immersion liquid which finds its way between the coverplate and an object which the coverplate surrounds but does not cover.

14. The apparatus of claim 1, wherein an outer edge of the coverplate is curved downwards.

15. The apparatus of claim 1, further comprising an outlet adjacent an outer edge of the coverplate configured to supply therethrough immersion liquid.

16. The apparatus of claim 1, further comprising a liquid supply system configured to supply liquid to cover a top surface of the substrate and a top surface of the coverplate.

17. A device manufacturing method comprising:
   holding a substrate on a substrate table;
   positioning the substrate table relative to a projection system using a positioner comprising a short stroke module for fine positioning movements, on which the substrate table is held;
   supporting the short stroke module on a long stroke module for coarse positioning movements; and
   covering at least partly a top surface of the short stroke module using a coverplate mounted to the long stroke module.

* * * * *